United States Patent [19] [11] Patent Number: 4,932,246
Deutsch et al. [45] Date of Patent: Jun. 12, 1990

[54] DIAGNOSTIC FAULT TEST SYSTEM AND CIRCUIT

[75] Inventors: Robert W. Deutsch, Sugar Grove; John Aseltine, Buffalo Grove; Stephen G. Oller, Schaumburg; Daniel D. Prochaska, Sr., North Lake, all of Ill.

[73] Assignee: Motorola, Inc., Schaumburg, Ill.

[21] Appl. No.: 313,770

[22] Filed: Feb. 22, 1989

[51] Int. Cl.⁵ ............................................ G01M 19/00
[52] U.S. Cl. ................................................. 73/119 A
[58] Field of Search .......................... 73/865.9, 119 A; 324/418, 420, 423; 123/479

[56] References Cited

U.S. PATENT DOCUMENTS

| | | | |
|---|---|---|---|
| 4,316,134 | 2/1982 | Balan et al. | 322/99 |
| 4,379,990 | 4/1983 | Sievers et al. | 322/99 |
| 4,589,401 | 5/1986 | Karim et al. | 123/479 |
| 4,736,267 | 4/1988 | Karlmann et al. | 361/101 |
| 4,764,840 | 8/1988 | Petrie et al. | 361/154 |
| 4,791,809 | 12/1988 | Schmidt | 73/119 A |
| 4,821,562 | 4/1989 | Inoue | 73/119 A |

OTHER PUBLICATIONS

Motorola Technical Developments, vol. 3, Mar. 1983.

Primary Examiner—Jerry W. Myracle
Attorney, Agent, or Firm—Phillip E. Melamed

[57] ABSTRACT

Diagnostic fault test system and circuit sequentially tests a plurality of drivers (12) and their associated solenoid loads (13). Control signals (PM, SM) are provided to the drivers by a computer controller (11) to achieve desired solenoid actuation. The controller temporarily alters the control signals such that all of the drivers are forced into an on or off state for a first time period ($t_A$ or $t_B$). After a delay ($t_{Don}$ or $t_{Doff}$) a signal ($V_M$) associated with each driver stage is monitored to determine if the driver and its load are operating properly. Then the controller resumes normal control of the drivers. The duration of the forced on/off state is short enough so as not to cause a change in the actuated/nonactuated state of the solenoid loads. Each monitored signal from the driver is sequentially compared to a high and low threshold (50, 51) to indicate either proper operation or the identification of one of two different types of fault which may occur. Drivers are preferably tested in both on and off states for proper operation and identification of a total of four different possible faults. Present system allows rapid testing of all drivers and their loads by use of a common transient setting delay time. Accuracy is improved since driver switching during fault monitoring is not permitted. Fewer components are needed since a single comparator (18) is used to sequentially compare each monitored signal for each driver with both high and low thresholds. Also, an indication of what type of fault is provided rather than just providing an indication that some fault exists.

31 Claims, 6 Drawing Sheets

| ON(1)/OFF(0) TEST (CONTROL) | EXTERNAL COMPARATOR OUTPUT STATES | | DRIVER OPERATION |
|---|---|---|---|
| | HI THR. | LO THR. | |
| 0 | 0 | 0 | NORMAL OFF |
| 0 | 0 | 1 | OPEN LOAD |
| 0 | 1 | 0 | INVALID STATE |
| 0 | 1 | 1 | SHORTED DRIVER TO B+ |
| 1 | 1 | 1 | NORMAL ON |
| 1 | 0 | 1 | OVERCURRENT (LOAD SHORT) |
| 1 | 1 | 0 | INVALID STATE |
| 1 | 0 | 0 | OPEN DRIVER |

DIAGNOSTIC FAULT TEST SYSTEM AND CIRCUIT

BACKGROUND OF THE INVENTION

The present invention is related to diagnostic fault test systems and circuits, and more particularly to the use of such systems and circuits for testing one or more electrical devices operated in effective on or off states in accordance with received control signals. The present invention has primary application to systems and circuits for sequentially testing a large number of driver stages for solenoids, but can be used in other applications.

Some prior fault diagnostic systems have monitored the entire operation of a complex electrical system and produced fault indications of what type of faults have occurred. U.S. Pat. No. 4,379,990 to Sievers et al., assigned to the same assignee as the present invention, shows one such system. While such a system is advantageous for monitoring the operation of an electrical system, it does not suggest how to rapidly test a number of specific driver stages in both on and off states while also preventing the misdetection of errors caused by monitoring the system during device switching transients. Most of the fault detector circuits in this system are constantly operative and subject to electrical switching transient signals. This system does monitor a single signal and compare it with both a high voltage and low voltage fault threshold, and in this respect, is similar to U.S. Pat. No. 4,316,134 to Balan et al. However, in both cases this comparison apparently occurs continuously and is thus subject to false error detections due to switching transients. In addition, clearly both of these references suggest utilizing separate comparators for comparing a monitored signal with both a high and low threshold. If a number of stages were to be monitored by such systems, this would lead to a substantial number of comparators being utilized and increase the expense and decrease the feasibility of providing such a fault system.

U.S. Pat. No. 4,372,267 to Karlmann et al, also assigned to the same assignee as the present invention, discloses a solenoid fault detection system/circuit which utilizes separate comparators, but now each comparator monitors a different signal and essentially tests for different fault conditions. While this system does contemplate the use of time delay windows to avoid erroneous fault detections due to transient signals, applying the teachings of this patent to test a plurality of solenoid driver stages would produce a complex and costly system having a substantial amount of circuitry used for testing each stage and requiring a substantial amount of time to implement all testing. U.S. Pat. No. 4,764,840 to Petrie et al., assigned to the same assignee as the present invention, discloses a solenoid current controller which monitors a solenoid current sense signal by the utilization of two separate comparators. This system does not really disclose a fault detection system, but merely illustrates how to control maximum and minimum solenoid currents.

U.S. Pat. No. 4,589,401 to Karim et al., discloses a microcomputer which controls the operative state of a number of solenoid driver stages utilized to control engine fuel injection. The system disclosed in this patent contemplates sequential testing of each of the solenoid driver injector circuits for fault conditions. However, in such a system incorrect fault detections may occur due to transient switching signals created by switching a driver stage either immediately prior to or during the time that the driver stage is monitored for a fault condition. Even if this system recognized that it might be necessary to wait a predetermined time after each switching transition before monitoring a driver stage, this would require delaying the fault monitoring by such a waiting time in accordance with each driver stage switching transition. Thus the fault detection system in the '401 patent would not be able to rapidly monitor all solenoid driver stages for faults. In addition, the fault monitoring achieved by the '401 system is essentially limited to determining either (a) if solenoid through current is present or not in accordance with whether or not the driver stage is actuated or (b) if the control signals being supplied to the driver device have failed. Thus, with regard to testing whether or not the driver stage and its associated solenoid have failed, only a limited amount of diagnostic information is available as to identifying what type of failure has occurred. In addition, the '401 system apparently uses multiple integrated circuit comparators each receiving a number of different input signals and comparing them with just one fault threshold level. Thus this system utilizes a substantial amount of circuitry to perform its limited functions.

SUMMARY OF THE INVENTION

An objective of the present invention is to provide an improved diagnostic fault test system and/or circuit which overcomes at least some of the above-mentioned deficiencies of prior systems/circuits.

In one embodiment of the present invention a multiple device diagnostic fault test system is provided. This system comprises: a plurality of electrical devices, each device selectively operative in effective on or off states in accordance with received control signals to control load apparatus associated with each of the devices; control means coupled to the plurality of devices for providing the control signals thereto in accordance with predetermined criteria to achieve desired control of the devices; means for testing each of said devices to insure proper operation of the devices and/or its associated load apparatus controlled thereby, the testing means including, means for temporarily altering the control signal being provided to at least some of the devices such that each of the devices is maintained in a same predetermined one of the on and off states for a predetermined first time period, means for monitoring each of the plurality of devices during this first time period for proper operation and developing a fault signal in response to detected improper operation, and means for having the control means resume control of said devices in accordance with the predetermined criteria after the first time period.

In the system described above, preferably the monitoring means will sequentially monitor each of the plurality of devices during the first time period when each device is in the same on or off state. The actual monitoring will preferably occur after an initial delay time after the beginning of the first time period. In this way, a single delay period for allowing all switching transients to die out is utilized, and then all of the devices are tested. The advantage of this is that all of the devices can be much more rapidly tested since individual transient delay times are not required prior to testing each individual device. The present system also insures that erroneous fault detections will be less likely since monitoring the devices does not occur at times during or relatively soon after a switching transient.

Preferably, the present system will sample all of the devices for faults in both their on and off states during associated first and second time periods, each of which periods having an initial delay time to permit the dying out of transient signals. In each case, during the first and second time periods the control signals are temporarily altered such that the monitored devices will all have the same on or off state.

Preferably, the system discussed above utilizes a diagnostic fault test circuit which includes a device testing means. The device testing means includes means coupled to the device for monitoring, during a predetermined first time period while the device is in a predetermined one of its on and off states, at least one signal from the device and comparing the magnitude of this monitored signal with both first and second threshold values. The first and second threshold values are distinct from each other and the testing means provides a first fault signal if the monitored signal exceeds the first threshold value in a predetermined polarity sense and provides a second fault signal if the monitored signal exceeds the second threshold value in a predetermined polarity sense. The providing of just the first fault signal is indicative of a first type of faulty operation, while the providing of both of the first and second fault signals is indicative of a second different type of faulty operation. Preferably, the monitoring means monitors the one signal during the first time period when the device is in one of its on or off states and also monitors the signal when the device is in the opposite one of its on or off states during a second time period which is separate and non-overlapping with the first time period. Also, preferably the monitoring means includes a comparison means which receives the monitored signal as an input and sequentially compares it to the first and second threshold values to provide the first and second fault signals. Also, preferably the diagnostic fault test circuit is utilized for monitoring a plurality of electrical devices corresponding to the recited one electrical device and is therefore utilized in the above-noted diagnostic fault test system.

An advantage of the above-discussed diagnostic fault test circuit is that the monitored signal from each electrical device need only be monitored within a predetermined first time period, and therefore this eliminates having the monitoring circuit permanently dedicated to monitoring each electrical device continuously. In addition, more comprehensive diagnostic information identifying what type of fault has occurred is achievalbe with the present fault test circuit, since you are not only advised that a fault exists, but also receive an indication of what type of fault may exist. When the device is tested in both its on and off states, a total of at least four distinct fault conditions can be identified or you can verify in both the on and off states of the device if its operation is proper. In addition, sequentially comparing the monitored signal with different thresholds reduces the number of comparators which may be required and thus minimizes the circuitry and cost for the diagnostic fault test circuit.

The above-noted features and advantages of the present invention, as well as additional features and advantages, are more fully described in the subsequent more detailed description of the present invention. The present fault test circuit and system, has primary applicability to driver stages for solenoids, such as solenoid fuel injection valves and solenoids which control vehicle automatic transmissions. However the present system and circuit also has applicability to on/off driver stages used for controlling other loads.

BRIEF DESCRIPTION OF THE DRAWINGS

For a more complete understanding of the invention, reference should be made to the drawings, in which.

DESCRIPTION OF THE PREFERRED EMBODIMENT

Figure 1:
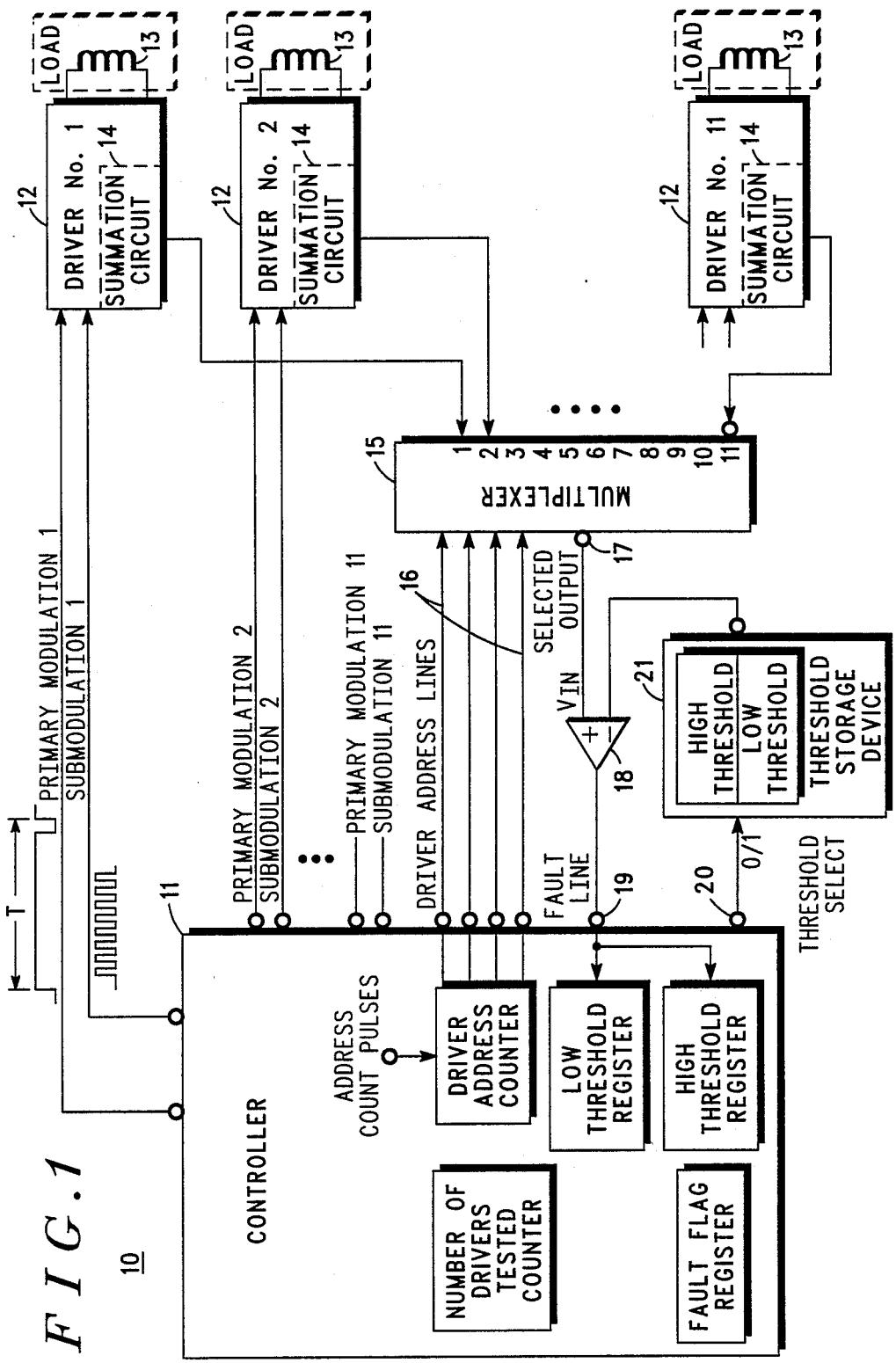
FIG. 1 is a schematic system block diagram of a diagnostic fault test system constructed in accordance with the present invention.

Referring to FIG. 1, a diagnostic fault test system 10 is illustrated. The system 10 includes a microprocessor controller 11 which generates pairs of separate control signals for each of eleven different solenoid driver stages 12, only three of which are illustrated in block form in FIG. 1. Each of the solenoid driver stages is selectively operative in effective on or off states in accordance with the control signals that it receives from the microprocessor controller 11, and the driver stages 12 each control a load apparatus associated with each of the driver stages in accordance with the received control signals. In the system 10, each of these load apparatus comprises a separate solenoid 13 indicated in FIG. 1 by a solenoid inductor having the same reference numeral. Preferably, the solenoids 13 comprise solenoid relays such as are used in vehicle automatic transmissions or solenoid-controlled valves such as used in vehicle fuel injectors.

For each of the driver stages 12, the controller 11 provides a separate associated primary modulation control signal PM and a submodulation signal SM. Preferably, the primary modulation signal comprises a pulse-width modulated excitation signal having a programmable period T wherein the signal between times $t_{on}$ to $t_{off}$ has a high logic state indicative of a desired on condition for the driver. During the remaining time period from $t_{off}$ to the next $t_{on}$ the signal PM has a low logic state indicative of an off condition. Preferably the signal PM for each of the driver stages is separately generated in accordance with some predetermined criteria which determines whether or not the driver stage is to be on or off and therefore control current to its associated load. In other words, the signals PM merely indicate whether or not the solenoid loads 13 should be actuated or not, and for what percentage of the period T these loads should receive excitation. The submodulation signal SM in general comprises a much higher frequency pulse signal, wherein these high frequency pulses exist continuously between the times $t_{on}$ to $t_{off}$ and wherein there is absence of such pulses between the times $t_{off}$ to the next time $t_{on}$. It is contemplated that the frequency of the SM high frequency pulses is such that applying these pulses to a driver stage, while resulting in switching the driver stage on and off at a very high frequency, will result in effective continuous actuation of its associated solenoid load due to the continued current flow through the solenoid being controlled by the driver stage, which includes the recirculation switch.

FIG. 5 illustrates typical waveforms for the signals PM applied to driver stages 1 and 2, and the signals SM applied to the same corresponding stages. It should be noted that while preferably the control signals provided by the controller 11 have the waveforms shown in FIG. 5, this is not necessarily the case for proper operation of the diagnostic system 10. The system 10 could operate with static DC control of the driver stages 1 through 11 wherein the controller, or other circuitry for producing the control signals, such as switches, merely provides a high control signal to a driver stage when its load is to be actuated, and a low logic level control signal to the driver stage when its load is not to be actuated. This would essentially correspond to a 100% or 0% pulse-width modulated signal depending upon whether the driver was to have an on or off state so as to actuate or not actuate its associated load. However, in the preferred solenoid control/test system comprising the system 10, pairs of primary and submodulation signals corresponding to those described above are provided to each of the driver stages. In addition, preferably the periods for the primary and submodulation signals for one driver do not necessarily have to be the same as the periods for the control signals associated with another driver stage. Also, clearly the duty cycles for the primary and submodulation signals for one driver stage do not have to be the same as the duty cycles for the primary and submodulation signals applied to another driver stage, especially when it is contemplated that each of the driver stages, and their corresponding loads, could be separately controlled in accordance with different predetermined criteria.

In other words, the broadest way of controlling the 11 driver stages shown in FIG. 1 would be to have each of them actuated to an on or off state in accordance with a separate switch. All that the controller 11 shown in system 10 is doing, per the preceding description, is to provide a pair of control signals that implements this function. Many prior vehicle controllers are able to determine when a fuel injector valve or solenoid relay is to be actuated in accordance with the desires of the vehicle operator and/or in accordance with monitored engine vehicle parameters. In this respect, the controller 11 merely implements the general control functions provided by these prior controllers. However, the controller 11 does differ from these prior controllers, which include controllers that produce primary modulation and submodulation pairs of controller signals, in that within each primary modulation period T there exists separate time periods $t_A$ and $t_B$. During these time periods $t_A$ and $t_B$ each of the driver stages 1 through 11 will be tested for faults while preferably each of the driver stages is forced into a common effective on or off state, respectively. The waveforms in FIG. 5 illustrate this in that during the on test time $t_A$, the submodulation signals to each of the drivers are altered such that a constant high state is provided for the SM signals rather than the high frequency pulses. Similarly, during the off test time $t_B$, again the existence of submodulation pulses in the signals SM are prevented and a constant low logic state is implemented. After the times $t_A$ and $t_B$, then the existence of the submodulation pulses in the signals SM corresponds to the existence of the high logic state for the corresponding associated primary modulation signal PM wherein the existence of this high state for the PM signal corresponds to the desired on or off state of the driver stage to be controlled and the desired actuated or nonactuated state of its associated solenoid load.

In other words, during an on test time $t_A$, which can occur at any programmable percentage of between 0 and 80% of the period T, the controller 11 will temporarily alter the submodulation signals SM being provided to each of the driver stages 1 through 11, such that each of the driver stages will now be maintained in a constant on state. After the on test time $t_A$, then control of the driver stages resumes in accordance with the waveform of the signal PM for each driver stage. In a similar manner, during the off test time $t_B$ the controller temporarily forces the submodulation signal SM for each driver stage to have a constant low logic state to insure that the driver stage is off. During the test time $t_A$ and $t_B$, on and off tests for each of the driver stages 1 through 11 will be sequentially implemented. In this manner, after an initial transient delay time (also termed a driver stabilization time) $t_D$, each of the driver stages 1 through 11 will be sequentially fault tested. This is shown in graphs E and F in FIG. 5 which show just times $t_A$ and $t_B$ with an expanded horizontal time axis. This results in having one common driver stabilization time prior to testing all of the 11 driver stages and therefore enables the present invention to more rapidly test all of the driver stages 1 through 11.

Of course it is understood that to avoid disruption of the states desired for the loads 13, the entire test times $t_A$ and $t_B$ are short enough such that these times are insufficient to permit any solenoid load apparatus in an actuated or nonactuated state immediately prior to the test time from changing state during the test time. As a safety feature, it should be noted that it may be desirable to prevent any driver stage from attempting to turn on and actuate its associated solenoid load when its primary modulation signal PM indicates that the load should be nonactuated. This can be readily achieved by the present system since both the primary modulation signal PM and the secondary modulation signal SM are both received by its driver stage. This is just a precautionary step to prevent any unintentional actuation of a solenoid load 13 just during the on fault test period $t_A$ when the solenoid is suppose to be in an off state per the signal PM.

The manner in which the system 10 sequentially tests each of the driver stages 1 through 11 for faults during both the on test and off test time periods $t_A$ and $t_B$ will now be described in detail. However, it should be noted that generating the primary and secondary modulation signals to control each of the driver stages is known in the prior art with the exception of forcing all of the driver stages 1 through 11 to have the same on or off state during their respective test times $t_A$ or $t_B$. Preferably the on test time $t_A$ occurs at any desired percentage of the total period T such as between 0 and 80%, whereas the off test time $t_B$ occurs at some other percentage of the total period T such as 93%. In any event, the on and off test times are separate and non-overlapping test times which comprise part of the primary modulation period of excitation for each of the driver stages 1 through 11. Implementing such control of the primary and secondary modulation signals is well within the capabilities of those in the vehicle solenoid fuel injector/automatic transmission control art. Especially since exciting solenoid loads by the application of high frequency pulses having an effective overall duty cycle corresponding to the on period of a primary modulation signal is well known. Having a computer controller 11 temporarily force the submodulation signal either high or low for some predetermined on or off test time period is readily achievable by persons of average skill in the art once the present invention has demonstrated how this provides a beneficial result in sequentially testing the plurality of driver stages 1 through 11 and their associated solenoid loads 13.

In the system 10 in FIG. 1, each of the driver stages 12 is shown as including a summation circuit portion 14 therein. Each summation circuit provides an output signal $V_M$ from the driver stage as an input to 11 separate input terminals of a multiplexer circuit 15. Four driver address lines 16 are connected between the controller 11 and the multiplexer 15 and essentially select which one of the 11 input signals $V_M$ from the driver stages 12 will be provided at a selected output terminal 17 of the multiplexer. The signal at this selected output terminal is designated as $V_{in}$ and is provided to the positive input terminal of a comparator 18 which has its output, designated as a fault line, connected to an input terminal 19 of the controller 11. A threshold select output terminal 20 of the controller 11 is connected as an input to a threshold storage device 21 having its output connected as an input to the negative input terminal of the comparator 18.

Essentially the threshold storage device 21 merely stores internal thereto two distinct analog threshold signals representative of a high threshold value and a low threshold value. In response to receiving either a 0 or a 1 logic signal from the terminal 20, either the high or low threshold analog signal is provided as an input to the comparator 18. The input signal $V_{in}$ is then compared with the selected threshold and the results of this comparison are provided on the fault line as an input to the terminal 19. The controller 11 then receives the result of this comparison and stores the result in either a low threshold or a high threshold register inside controller 11, depending upon whether the high or low threshold was selected. After both the high and low thresholds are selected for comparison with one input signal $V_{in}$, the controller 11 determines if a fault was detected. If so, the existence of this fault, an indication of what type of fault was detected, and an indication of which driver stage had this detected fault is then stored in a fault flag register internal to the controller 11. If no fault has been detected in testing one driver stage, then an internal driver address counter within the controller 11 receives an additional address count pulse, addresses the next sequential driver stage via the multiplexer 15, and the fault testing occurs for this next driver stage. This testing continues until all 11 driver stages have been tested during both their on and off states for faults and no faults had been detected, or until a fault has been detected in a driver stage. This will be explained more fully in connection with the flowcharts illustrated in FIGS. 6A, 6B and 7.

Referring to FIG. 5, an extended timing diagram for the on test period $t_A$ is illustrated which illustrates the initial delay or driver stabilization period $t_{Don}$ which precedes the actual testing of each of the driver stages 1 through 11. Immediately after the driver stabilization period $t_{Don}$, the comparator 18 compares the magnitude of a selected driver stage output signal $V_{in}$ provided as the signal $V_{in}$ at the terminal 17 against the low threshold value provided by the threshold storage device 21, and then this same signal is compared to the high threshold level provided by the threshold storage device 21. Then, in general, a next driver stage is selected by the controller 11, via the multiplexer 15, and the process is repeated until all of the driver stages have been tested. FIG. 5 illustrates that the testing sequence during the off test time $t_B$ is substantially similar.

The fact that a single comparator 18 is utilized with separate high and low threshold values provided sequentially by the threshold storage device 21 means that the present embodiment utilizes a minimum of hardware to effectively test faults for a large number of on/off driver stages and their associated loads. The present embodiment does not require a separate comparator 18 for each of the driver stages 1 through 11 due to the operation of the multiplexer 15 and the selective application of both high and low thresholds by the threshold storage device 21. This provides a substantial saving in the amount of circuitry required by the present embodiment.

The reason why two separate thresholds are utilized by the system 10 is that if the monitored signal $V_{in}$ exceeds just the low threshold, in a first polarity sense, but not the high threshold, this would be indicative of one type of fault which may exist, but if the signal $V_{lin}$ exceeds both the high and low thresholds in the same polarity sense, then this is indicative of a different type of fault. Thus the use of two separate thresholds provides diagnostic information which could not be obtained by merely comparing a monitored signal with a single threshold and providing a resultant 0 or 1 digital signal to the controller 11. Since the present invention contemplates performing both on and off tests for each of the drivers, and using high and low thresholds for each of these tests, a total of four different faults are identifiable by the present diagnostic system. In addition, the proper operation of each driver is tested during its on state and during its off state. This provides for testing each of the drivers for proper operation during both on and off conditions, as well as the identification of four different types of faults which may occur for any of the driver stages. The manner in which this occurs will now be discussed in more detail.

Figures 2, 3, 4:
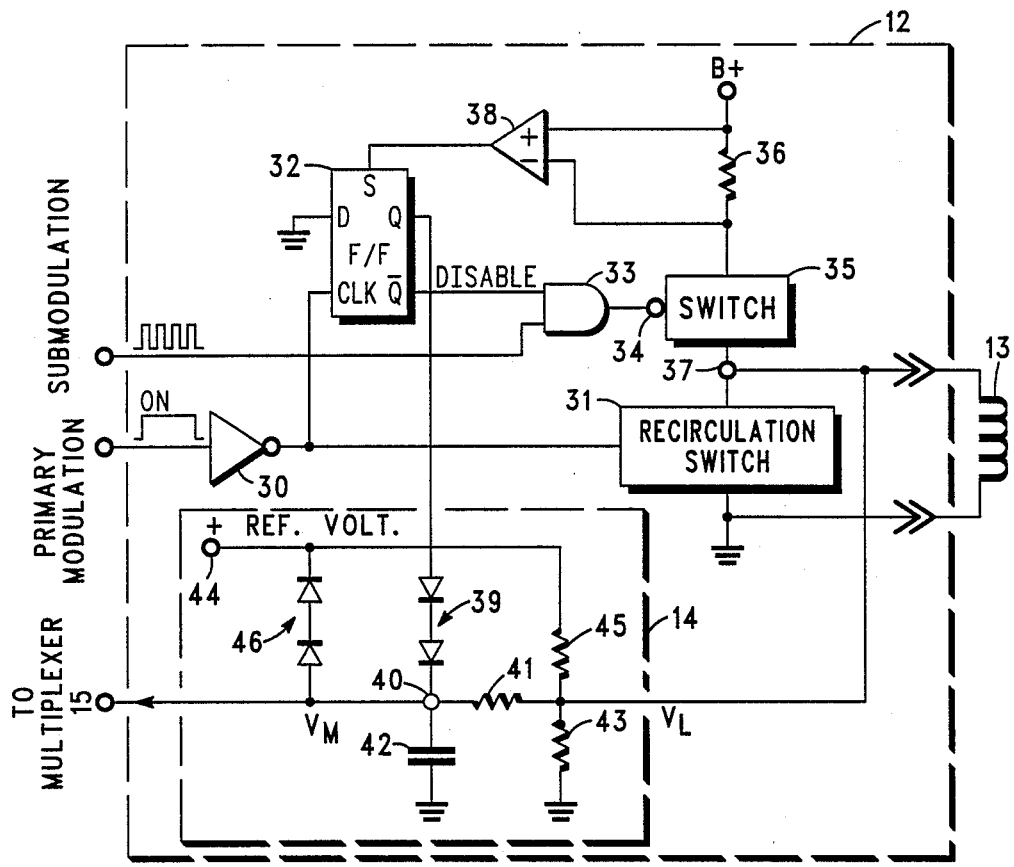
FIG. 2 is a schematic diagram of a typical driver stage and its associated load utilized in the system shown in FIG. 1.
FIG. 3 is a graph illustrating the comparison thresholds used in the system shown in FIG. 1.
FIG. 4 is a table illustrating the results of signal comparisons performed by the FIG. 1 system and the faults which they are indicative thereof.
Figure 5A:
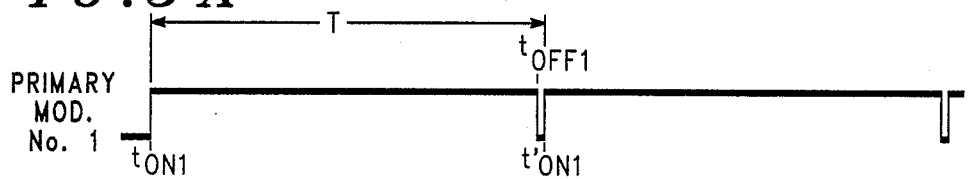
FIG. 5 comprises a series of graphs A-F illustrating the waveforms for various signals produced by the system in FIG. 1 and timing diagrams illustrating the sequential testing implemented by the FIG. 1 system.
Figure 5B:
Figure 5C:
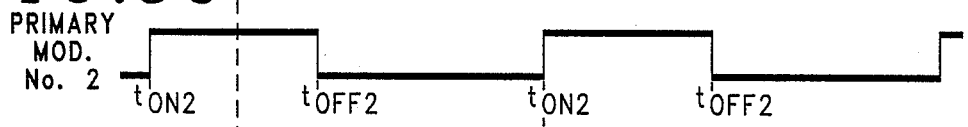
Figure 5D:
Figure 5E:
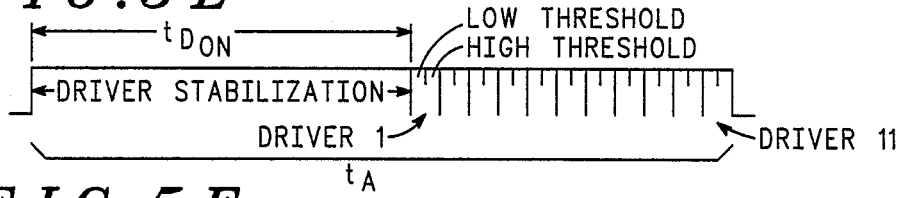
Figure 5F:
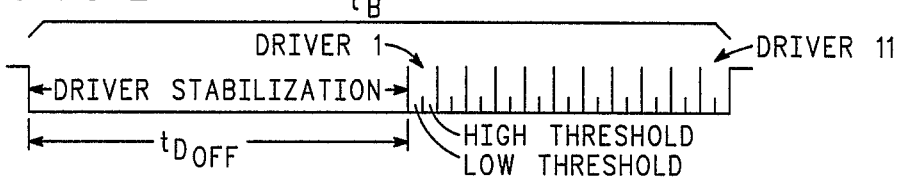

Referring to FIG. 2, a typical embodiment for one of the driver stages 12 is illustrated. The driver stage receives the primary and secondary modulation signals PM and SM and provides output excitation signals to its associated load which preferably comprises a solenoid 13. The driver stage 12 shown in FIG. 2 comprises a high side, as opposed to low side, solenoid driver, but most aspects of the present invention are equally applicable to high or low side drivers. The pulsewidth modulation signal PM is provided through an inverter 30 to a recirculation switch 31 and the clock terminal of a flip flop 32. The submodulation signal SM is provided as an input to an AND gate 33 having its output connected to a control terminal 34 of a switch 35 preferably comprising an FET transistor. The switch 35 is coupled to a power supply terminal B+ (at which a B+ voltage potential is provided) through a current sensing resistor 36 and is connected in series with its associated solenoid load 13 between the resistor 36 and ground potential. A terminal 37 between the switch 35 and load 13 provides the circuit node at which a load signal $V_L$ is produced which will essentially be utilized by the summation circuit 14 to produce the signal $V_M$ monitored by the system 10 and provided as an input to the multiplexer 15.

A comparator 38 is connected across the current sensing resistor 36 so as to provide a high logic state if excessive current is detected through the resistor 36. The logic state output of the comparator 38 is connected as an input to the set terminal S of the flip flop 32 which has its data terminal D connected to ground and its not Q terminal connected as a DISABLE input signal to the AND gate 33. The output Q terminal of the flip flop 32 is coupled through two series-connected diodes 39 to a terminal 40 connected through a resistor 41 to terminal 37 and connected to ground through a filtering capacitor 42. The terminal 37 is connected to ground through a resistor 43 and connected to a positive 5-volt reference voltage, lower than the B+ voltage, at a terminal 44 through a resistor 45. The terminal 44 is also connected to the terminal 40 through two series-connected diodes 46 such that these diodes essentially clamp the voltage $V_M$ at the terminal 40 so that it cannot exceed the 5-volt reference voltage by more than two forward-bias diode drops. The above connections represent the basic typical structure of one of the driver stages 12. The signal at the terminal 40 is designated as $V_M$ to indicate that this is the voltage provided to the multiplexer as the monitored signal from the driver stage 12. The operation of the driver stage 12 in accordance with the present invention will now be discussed.

In response to receipt of a positive-going transition at its clock terminal, which corresponds to the end of a previous primary modulation pulse, the flip flop 32 will produce a high signal at its not Q terminal and thereby permit the AND gate 33 to pass any subsequent submodulation pulses to the control terminal 34 of the switch 35. During the commencement of the next series of submodulation pulses, which correspond to when the solenoid 13 should be actuated, the AND gate 33 will pass these pulses to the switch 35. Because of the high repetition rate of these pulses, the switch 35, even though being switched on and off at a very high rate, will provide enough excitation to actuate the solenoid 13 and maintain it in an actuated state. When the submodulation pulses cease at the end of the desired actuation of the solenoid 13, corresponding to termination of the primary modulation signal PM, this results in the signal PM turning on the recirculation switch 31 to dissipate the energy stored in the solenoid 13. The operation of such a recirculation switch is conventional. The termination of the submodulation pulses also results in having the switch 35 maintained in an off condition.

If, while the switch 35 is on an excessive current is drawn through this switch and the current sensing resistor 36, the comparator 38 will produce a high logic output signal which will set the flip flop 32 such that the not Q output of this flip flop will prevent submodulation pulses from continuing to turn on the switch 35. The effect of this is that for excessive sensed current, the switch 35 will be shut off since the gate 33 will prevent submodulation pulses from turning the switch on until the flip flop 32 is reset at the end of the primary modulation signal high logic state. This condition will also result in having the flip flop 32 produce a high logic state at its Q output terminal until this occurs, and this high logic state will correspond to a +5-volt reference voltage since the flip flop 32 provides such an output as its high logic state output.

When a driver stage is selected by the multiplexer 15 for monitoring, this essentially results in the signal $V_M$ of that driver stage being coupled through the multiplexer 15 to the terminal 17 wherein this signal now corresponds to the signal $V_{in}$ provided as one input to the comparator 18. As was previously noted, initially this monitored signal is first compared with a low threshold value stored in the sotrage device 21 and then a high threshold value. Referring to FIG. 3, a graph is shown illustrating the high and low threshold values, 50 and 51, with respect to the B+ voltage maintained at the B+ terminal shown in FIG. 2. Essentially, during the desired on test period, $t_A$, when the switch 35 is forced into a constant on state, the proper magnitude for the voltage $V_L$ and the voltage $V_M$ will be high and above the high threshold 50 shown in FIG. 3 and above the low threshold 51 shown in FIG. 3. This is because when the switch 35 is on, it will essentially act as a short circuit and couple substantially all of the B+ voltage to the terminal 37 resulting in the voltage $V_L$ corresponding to B+ voltage and the voltage $V_M$ corresponding to the +5 volt reference voltage at terminal 44 plus two diode drops. Thus the signal $V_M$ at the terminal 40 will exceed both the high and low threshold values 50 and 51 in a positive sense meaning that the absolute magnitude of this voltage will be greater than both of the thresholds. Thus, when this signal $V_M$ is compared with the low threshold, or when it is subsequently compared with the high threshold, normal operation of the driver stage 12 will produce high logic outputs for the comparator 18 indicative of normal operation. This is demonstrated by the table shown in FIG. 4.

For the table in FIG. 4, the initial column represents the on or off state of the switch 35 represented by a 1 or 0 logic state for the signal at the control terminal 34, the next two columns represent the output of the comparator 18 when the monitored signal $V_M$ is compared with a high threshold and a low threshold and the last column in the chart represents a word description of the detected driver operation. If, during the on testing of the driver stage 12, the switch 35 corresponded to an open circuit when it was supposed to be in an on state, then a very low voltage would be present at the terminal 37 resulting in the monitored signal $V_M$ being below both of the high and low thresholds 50 and 51 shown in FIG. 3, or exceeding both of these thresholds in a negative polarity sense. If, the switch 35 was acting as a short circuit when it was in its on state, but for some reason an excessive amount of current was drawn, such as in the case of the load 13 representing a true short circuit, then the flip flop 32 would be set by comparator 38. This means the flip flop Q output of +5 volts would be coupled through the diodes 39 to the terminal 40 causing the voltage $V_M$ to have a magnitude which exceeded the low threshold 51, but did not exceed the high threshold 50. Thus, by comparing a monitored driver stage signal $V_M$ sequentially with two separate thresholds, an indication of two different fault conditions for a driver stage which is supposed to be on can be detected by the logic states produced by the comparator 18. In addition, the table in FIG. 4 also shows that for a proper operating driver stage and load, when the driver is suppose to be on, the signal $V_M$ exceeds both high and low thresholds.

The controller 11 of course can recognize when the monitored driver stage is supposed to be on or off since it produces the primary and submodulation signals PM and SM. The controller 11 can also recognize when the comparator 18 was receiving a low threshold value or a high threshold value, since the controller selects these thresholds based on the signal at the terminal 20. In addition, the controller 11 can identify which one of the driver stages is having its signal $V_M$ monitored since the controller 11 produces the signals on the driver address lines 16 which tell the multiplexer 15 which driver stage it should effectively select for determining the input signal $V_{in}$ at the terminal 17. Thus, the present system 10 enables the controller 11 to determine which driver stages have faults and to provide an indication of what type of faults these are.

Figure 8:
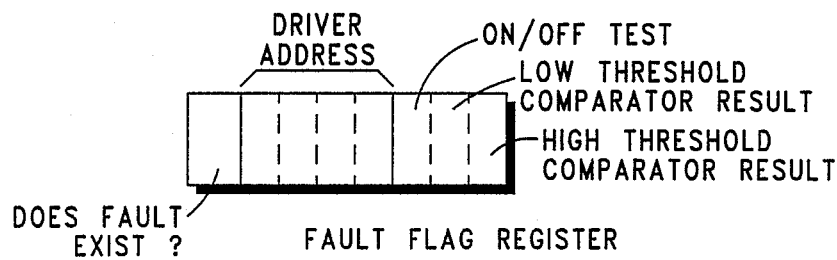
FIG. 8 comprises a diagram illustrating various storage locations in a fault flag register contained in the system in FIG. 1 in which fault data is stored.

As was previously indicated, the result of the low threshold comparison from the comparator 18 is stored in a low threshold register in the controller 11 and the results of the high threshold comparison is stored in a high threshold register. After both tests for any one monitored signal $V_M$, the controller, if it detects that a fault exists, will then store this fault information in a fault flag register generally shown in FIG. 1 and more specifically shown in FIG. 8. In FIG. 8, the fault flag register has a leading bit in which a 1 in this location indicates if a fault exists. The next four bits in this fault flag register record the address of the driver stage for which the fault has been detected. The next bit determines whether the fault occurred during an on or off test. The next bit stores the result of the low threshold comparison which was stored in the low threshold register and the next bit stores the result of the high threshold comparison which was stored in the high threshold register. If no fault has been detected, then the system merely addresses another driver stage and the process continues. Thus, it is apparent that the information stored in the fault flag register can construct the fault table shown in FIG. 4 for detected faults.

Testing the driver stage 12 during off times, instead of during on times, will result in a similar detection of faults. These off test faults would be indicative of the solenoid 13 providing an open circuit or the driver 35 providing a short to B+ during an off test. These off test results are shown in the FIG. 4 table along with the on test results. By using combinational logic the information in the fault flag register 8 can readily construct the entire diagnostic fault table reproduced in FIG. 4.

It should be noted that during the off test period $t_B$, when the switch 35 is forced off by forcing the submodulation pulses to cease for the time period $t_B$, normal operation of the driver stage 12 would mean that a low voltage would be provided at the terminal 37 resulting in the signal $V_M$ exceeding both the high and low thresholds in a negative sense. In other words, the signal $V_M$ will be below both thresholds indicating normal operation for the off testing of a switch 35. If during the off testing of switch 35, the switch was actually representative of a short circuit, then approximately B+ voltage would be provided at the terminal 37 resulting in the signal $V_M$ exceeding both thresholds 50 and 51 in a positive sense (being above both thresholds). If during the off testing of the switch 35 the load 13 represented an open circuit, rather than its relatively low resistance, then the resistors 45 and 43 would provide some interim voltage at the terminal 37 by virtue of the +5 voltage reference voltage produced at the terminal 44. This interim voltage, preferably midway between the thresholds 50 and 51, would be between the low threshold 51 and high threshold 50 thereby exceeding one of these thresholds but not both of them in the same polarity sense. This would be indicative of a fault condition comprising the load 13 corresponding to an open circuit.

It should be noted that preferably the present invention contemplates utilizing only two thresholds which are stored in the threshold storing device 21. These two thresholds can be utilized to provide the proper fault indications for both on and off testing of the driver stages 12 by appropriate selection of the resistors and reference voltages shown in FIG. 2. However, it is also possible to store four different threshold values in the storage device 21 and have the controller 11 select not only a high or low threshold but also select different high thresholds depending upon whether an on or off test is being conducted and different low thresholds depending upon whether an on or off test is conducted. However, this can be avoided by proper selection of the resistors and reference voltages for the driver stage 12 shown in FIG. 2.

It should be noted that the configuration illustrated in FIG. 1 for the comparator 18 providing logic signals to the controller input fault terminal 19 is preferred. In this configuration the comparator 18 will provide one pair of logic signals to indicate normal operation during an off test (0 logic signals) and an opposite pair of logic signals (1 logic signals) to indicate normal operation during an on test. This is demonstrated by the table in FIG. 4. This is preferred since it guards against the controller 11 interpreting no change in the signal at the terminal 19 as being indicative of a no fault condition when this could just represent a broken fault line connection between the comparator 18 and the terminal 19 or a short of this connection to a fixed voltage. However, preferably the logic states stored internal to the controller 11 may be inverted for either the on or off tests, but not both. In this manner, the same pair of either 0 or 1 logic states would be indicative of normal operation for both the on and off tests being conducted. However, this preferred selective inversion of fault signals internal to the controller 11 is not essential.

With regard to the table in FIG. 4, it should be noted that two combinations of testing are identified as invalid states. The reason for this should be apparent in that such logic states would indicate that the monitored signal during either an on or off test exceeded both thresholds in one polarity sense but didn't exceed one of the thresholds. This is a physical impossibility assuming that the proper thresholds are being provided to the comparator 18 and that the comparator 18 is operating properly. Thus, if these invalid states ever did occur, they would not be indicative of a fault of the driver stage, but would be indicative of a fault in the fault diagnostic system circuitry rather than a fault in the driver stages.

Figure 6A:
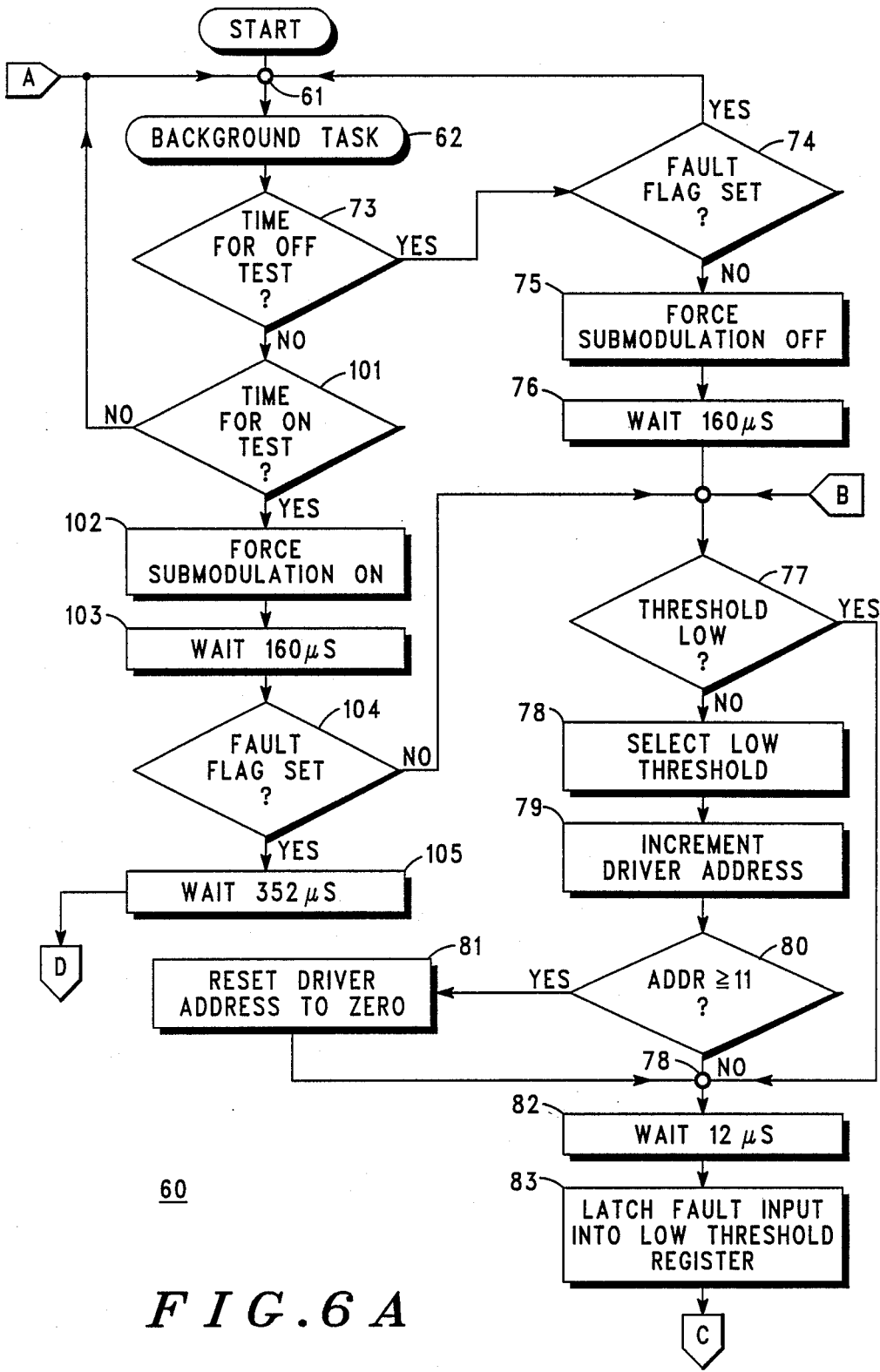
FIGS. 6A and 6B comprises a flowchart illustrating the operation of the fault system shown in FIG. 1.
Figure 6B:
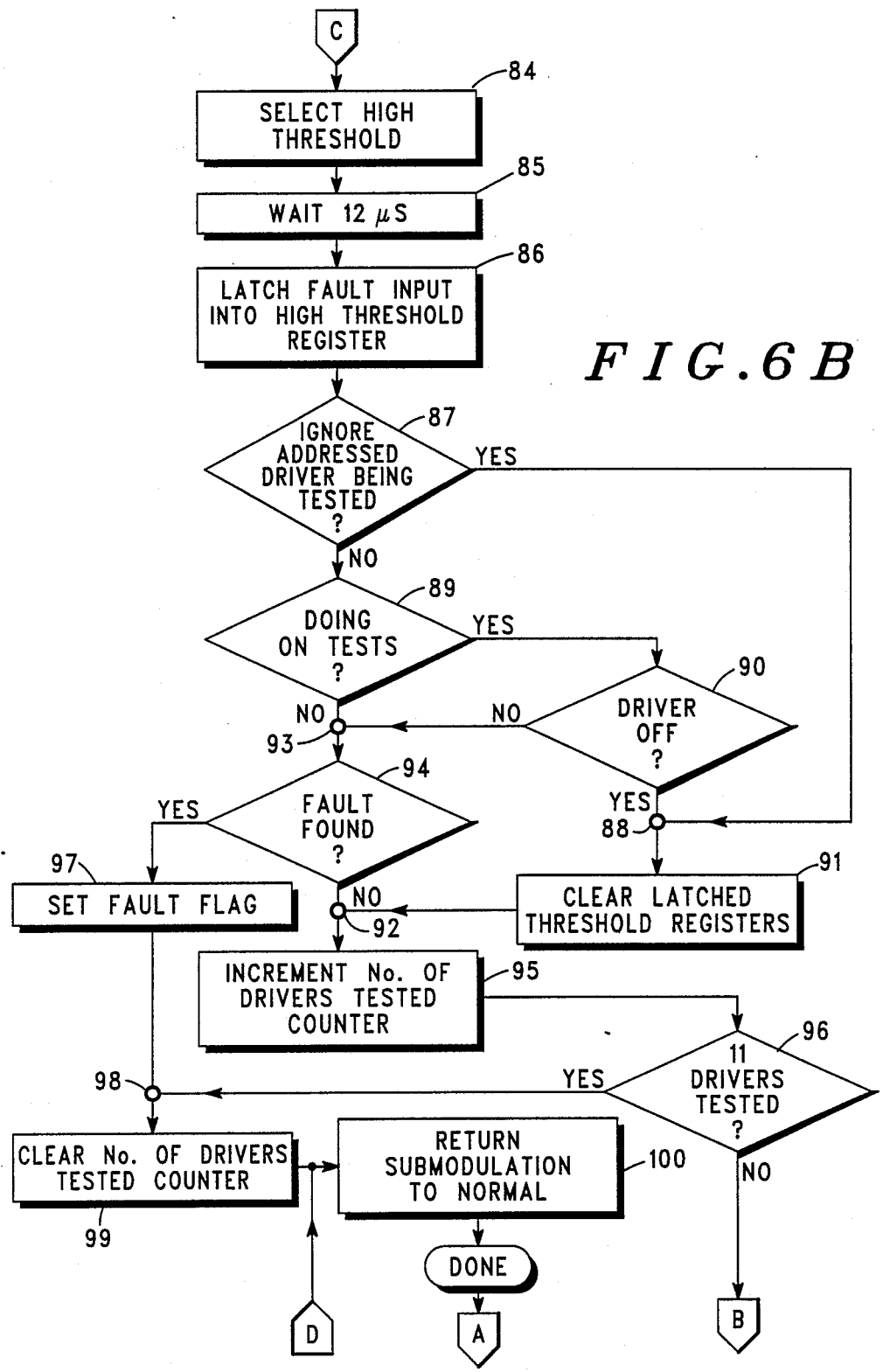
Figure 7:
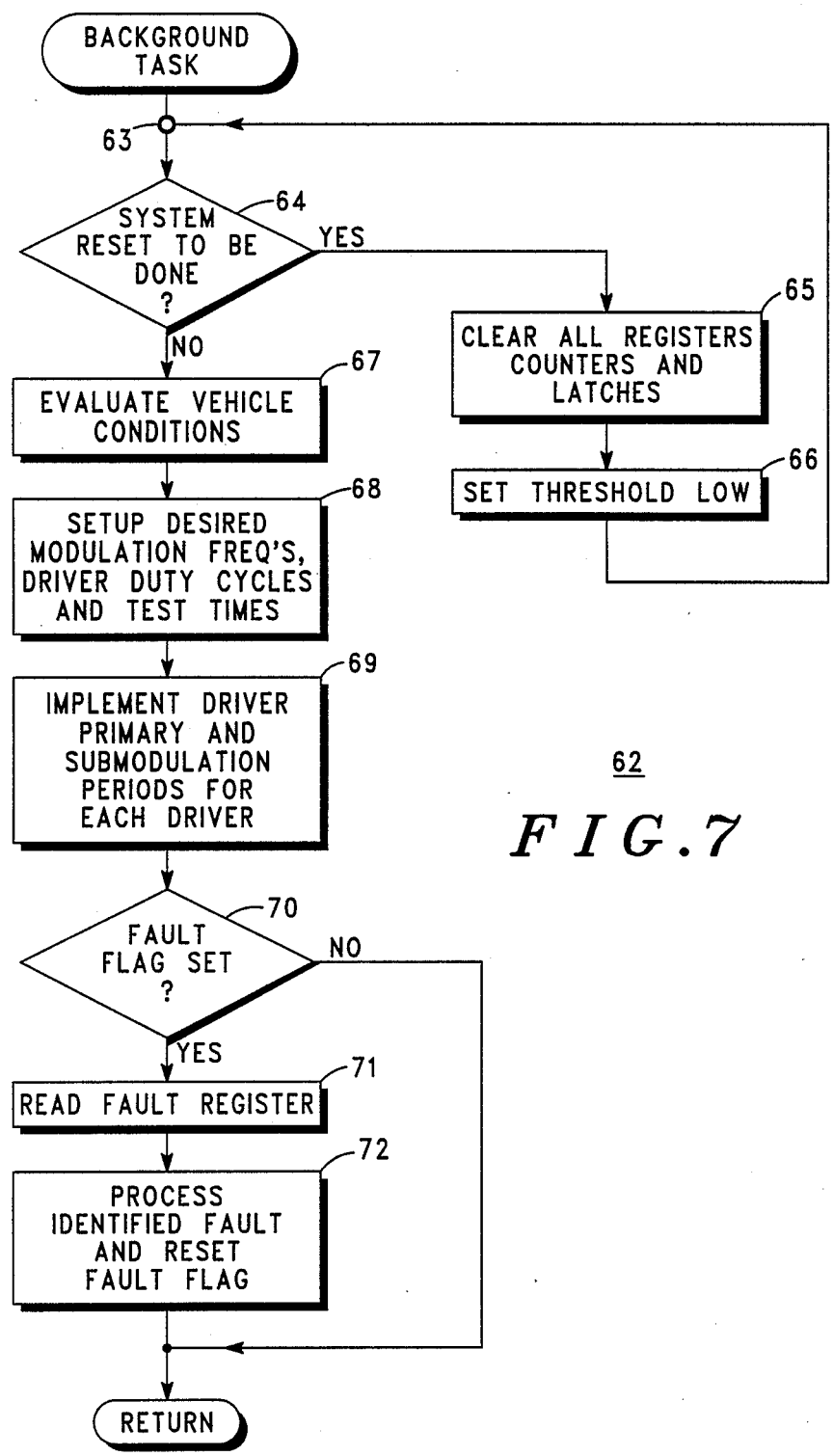
FIG. 7 comprises a flowchart subroutine for one of the processes indicated in FIG. 6A.

While a complete description of the operation of the present invention is believed to be stated above, reference to the flowcharts in FIGS. 6A, 6B and 7 may be beneficial as these charts indicate the steps for sequentially testing each of the driver stages 1 through 11. These steps correspond to the operations implemented by the controller 11 and other circuitry in the diagnostic system 10 shown in FIG. 1.

Referring now to FIGS. 6A and 6B, a flowchart 60 is illustrated which starts at an entry terminal 61. From there, a background task subroutine 62, shown in FIG. 7, is entered. Referring to FIG. 7, the background subroutine 62 starts at an initial terminal 63 and proceeds to a decision block 64 which inquires if a system reset is to be implemented. If so, all registers, counters and latches are cleared by block 65 and the controller 11 will set/-select the low threshold value from the threshold storage device 21 by means of a process block 66. This merely corresponds to the controller 11 producing a low logic signal at the terminal 20. Control then returns to the terminal 63.

If the decision block 64 determines that a reset is not to be implemented at this time, control passes to a process block 67 which evaluates vehicle conditions so as to determine which of the driver stages 12 should be actuated and for how long this actuation should occur. In other words, as was previously noted, preferably the present fault diagnostic system is utilized in vehicle fuel injection and transmission control systems. As part of the background task subroutine 62 the controller, as is the case in any other vehicle automotive controller, determines desired engine performance and calculates the timing and amount of fuel to be injected into the cylinders, the actuation states of various operator and-/or engine controlled switches and what sort of solenoid actuations should be implemented in response to these conditions. In the simplest type of system, this evaluation of vehicle conditions could just be the monitoring of a number of manually operated switches to determine which solenoid drivers are to be turned on and which are not. For fuel injection control, more complex calculations are necessary, but these are conventionally implemented by microprocessor controlled fuel injection systems.

After process block 67, control passes to process block 68 which calculates the desired modulation frequencies, driver stage duty cycles and the test times for implementing the on and off test times $t_A$ and $t_B$. As indicated previously, prior vehicle control systems are known which implement both primary and submodulation control for solenoids, and clearly implementing such controls in accordance with pulse width modulation is well understood by those of in the vehicle control art. With regard to setting up the specific test times $t_A$ and $t_B$ for a predetermined period T, it is a relatively simple matter of taking a desired period T and establishing a predetermined duration time period $t_A$ or $t_B$ which occurs at a predetermined percentage of this period T. This is what the process block 68 represents, and this process block is readily implementable by prior art techniques.

From process block 68, control passes to block 69 which essentially implements the driver primary and submodulation signals for each of the driver stages 12. In other words, process block 68 sets up the proper times for controlling the driver stage excitation and process block 69 implements such driver stage excitation control. As part of process block 69, or immediately subsequent to its initiation, decision block 70 is encountered which inquires if the fault flag has been set. If not, driver stage control continues since the subroutine 62 then returns to the main flowchart 60. If the fault flag has been set, process block 71 reads the fault flag register shown within the controller 11 in FIG. 1. Then a process block 72 processes the identified fault information and resets the fault flag if that is desired. What is intended by process block 72 is that, since an identification of exactly what fault has occurred in now available due to the present diagnostic system, the system 10 determines if all excitation signals for the driver stage in which the fault was detected should be terminated or whatever other type of corrective action should be implemented. This corrective action could comprise not only shutting down that particular faulty driver stage, but also preventing any further testing of that driver stage. This may be necessary because the present flowchart 60 ceases further fault testing once one driver stage has a fault detected in it, and the fault flag is set. In order to continue any further testing of the remaining driver stages, it will be necessary to reset the fault flag after some corrective action has been taken. Process block 72 could also comprise providing a warning to the vehicle operator that a fault has been detected as well as identifying to the operator the precise nature of the detected fault and which of the driver stages the fault was detected in. After the process block 72 control returns to the main flowchart 60.

After the background task subroutine 62, a decision block 73 inquires if it is time for performing the off tests during the time $t_B$. If so, a decision block 74 asks if the fault flag has been set indicating that a fault has been detected and not reset. If so, no testing will occur since control again passes to the terminal 61 to wait for the resetting of the fault flag via the background task subroutine 62. If the fault flag is not set, decision block 74 then proceeds to process block 75 which forces the submodulation signals SM for all of the drivers into an off state by preventing any of the signals SM going to the drivers from having positive going pulses during this time. A process block 76 then implements a delay time corresponding to the off test driver stabilization period $t_D$ off.

Control then passes to a decision block 77 which inquires if the signal present at the terminal 20 has selected a low threshold from the threshold storage device 21. If the answer to this inquiry is yes, it indicates that this is the first time that decision block 77 has been executed since a system reset, since the background task subroutine 62 set the threshold low via the process block 66. In such a case, control passes to a summing terminal 78. If the decision block 77 determines that the signal at terminal 20 is not selecting a low threshold from the storage device 21, process block 78 will then select a low threshold from the storage device. Process block 79 will then effectively increment the driver address sent via the driver address lines 16 from the controller 11 to the multiplexer 15. This occurs by incrementing a driver address counter internal to the controller 11 by permitting one additional address count pulse as an input to this driver address counter. The driver address counter is shown in FIG. 1 to aid in understanding the present operation, but such operation is conventional. After process block 79, a decision block 80 determines if the incremented driver address now exceeds the 11 possible addresses 0 to 10 for the 11 driver stages to be monitored. If so, then process block 81 resets the driver address to 0 to select driver stage 1 and control passes to the summing terminal 78. If not, then control passes directly from block 80 to the terminal 78. Essentially the blocks 77 through 81 merely result in the multiplexer 15 sequentially selecting the signal $V_M$ from each of the driver stages 1 through 11 as the signal $V_{in}$ to be provided at the terminal 17.

From terminal 78, a process block 82 provides a brief waiting delay and then a process block 83 latches the fault input received from the comparator 18 into the low threshold register internal to the controller 11. A process block 84 then selects the high threshold from the threshold storage device 21, by virtue of the signal at the terminal 20. Then, after a brief delay via a process block 85, a process block 86 latches the fault input signal received from the comparator 18 into the high threshold register internal to the controller 11. The steps 82 through 86 represent sequentially selecting both low and high thresholds for comparison with the monitored signal $V_M$ from one of the selected driver stages and storing the results of these comparisons in low and high threshold registers inside the controller 11. By analysis of this information, it will be determined if a fault exists, since the controller 11 will analyze this data in accordance with the table illustrated in FIG. 4.

From process block 86, control passes to a decision block 87 which determines if the test results from the address driver which is being tested should be ignored. The decision block 87 is provided for program flexibility since in some cases it may be desired to ignore the test data from a driver stage which is known to be faulty wherein this knowledge was obtained during a previous fault test sequence. Also, it may be that one of the driver stages is known not to have a load attached to it and therefore test data from testing this addressed driver should be ignored. If the test data is to be ignored, control will pass to a summing terminal 88.

If the decision block 87 determines that the test data for the driver stage being tested is not to be ignored, control passes to a decision block 89 which inquires if driver stage on tests are being implemented during the time period $t_A$. If so, control passes to a decision block 90 which inquires if the driver stage being tested is suppose to be off at this time according to its primary modulation signal PM. If so, then control will pass to the summing terminal 88. The reason for this is that, as was mentioned previously, if the primary modulation signal for a driver stage indicates that it is to be off, the controller 11 will not force a submodulation signal to turn that driver stage on during the time period $t_A$. Thus, any test data achieved by testing a driver stage for an on test, when the driver stage cannot be on because the controller 11 has not turned that driver stage on will result in false data, and so control passes to the summing terminal 88. This is the same situation that exists if test data has been received for a driver stage that is to be ignored with regard to its test data. From the summing terminal 88, control passes to a process block 91 which clears the latched threshold registers in the controller 11 thus erasing the fault test data which is therefore to be ignored. Control then passes to a summing terminal 92.

If the decision block 89 determines that on tests are not being conducted, or if the on tests are being conducted but the decision block 90 determines that the driver stage being tested is not suppose to be in an off condition, then control passes to a summing terminal 93 and then on the a decision block 94 which determines if a fault has been detected. This fault detection decision block 94 essentially inquires as to the contents stored in the low and high threshold registers in the controller 11. By analyzing the contents of these registers and by utilization of the table in FIG. 4, it can be determined if a fault has been found. If not, control passes to the terminal 92 and then on to a process block 95 which increments by 1 a number of drivers tested counter located internal to the controller 11. From there, control passes to a decision block 96 which determines if a total of 11 driver stages have been tested. If not, control again passes to the threshold low decision block 77 so as to implement the additional testing of another driver stage. Essentially, the function of the block 95 and 96 is to insure that all 11 driver stages are tested during either the on or off test periods before resuming normal operation, unless a fault was detected by the decision block 94.

If decision block 94 detects a fault, control passes to a process block 97 which implements setting the fault flag register shown within the controller 11 in FIG. 1 and shown in more detail in FIG. 8. This fault flag register, as was previously indicated, identifies which driver stage had the fault, whether the fault was an on or off test fault and also the results of the low and high threshold comparisons. This information identifies what stage had a fault and, via the table in FIG. 4, identifies what type of fault was detected. After the process block 97, control passes to a summing terminal 98. Control also passed to this terminal if the decision block 96 determined that all 11 drivers have been tested. After the terminal 98, control passes to a process block 99 which clears the number of drivers tested counter within the controller 11. Control then passes to a process block 100 which implements the resumption of the normal submodulation pulses being provided by the controller 11 in accordance with the desired states to be implemented for the driver stages 1 through 11. In other words, after the testing sequence, the forcing of the submodulation signals SM so that each driver stage has the same operative state is discontinued. After the process block 100, control passes back to the initial terminal 61.

What has been described so far implements the procedures for conducting the off time tests during the time periods $t_B$ for each of the driver stages 1 through 11. If the decision block 73 determines that it is not time for the off testing of the driver stages, decision block 101 inquires if it is time for performing the on tests for the driver stages during the time period $t_A$. If not, control returns to the initial terminal 61. If it is time for conducting the on tests of the driver stages, control passes to the process block 102 which results in forcing the submodulation signals constantly on for those driver stages which are intended to be on by virtue of the primary modulation signal having a high logic state. Then, a process block 103 implements a driver stabilization delay time $t_D$ on. Afterwards, a decision block 104 determines if the fault flag has been set indicating that a fault has been detected but the background task subroutine has not reset the fault flag. If the fault flag is set, a process block 105 then implements an additional delay period and then control passes to process block 100 by which the controller 11 resumes the normal submodulation excitation for each of the driver stages 1 through 11.

The decision blocks 74 and 104 effectively refuse to do fault testing if a fault has been previously detected but the background task subroutine has not analyzed this fault and taken some corrective action while resetting the fault flag. The only difference is that the flowchart 60, via block 102, will implement forcing the submodulation signal on for some short period and then the flowchart returns to normal submodulation pulses after a delay. The reason for this is that in some situations it may be desirable to have a forced constant on time for the submodulation pulses even though testing will not occur during this on time period.

If the decision block 104 determines that the fault flag is not set, then control passes from the decision block 104 to the threshold low decision block 77. If this occurs, then the blocks 77 through 100 are executed in the same manner for the current on test during $t_A$ as they were previously executed for the off test during $t_B$. The only differences are the decisions made by the decision block 89, which asks if on or off tests are being performed, and the setting of the fault flag by block 97 which will store, in the fault flag register, an indication of whether the fault that was detected was detected during an on or off test.

It should be noted that the diagnostic system described herein may also be used to detect faults related to additional electrically controllable low side switches added in series with the solenoid 13 between the solenoid and ground. The diagnostic system can distinguish between an open solenoid 13 and an open circuit fault in one of these additional switches in a driver stage by noting the correct on/off functionality of such additional switch and by noting that with the additional switch closed and the switch 35 closed (on) no faults are detected and that when the additional switch is opened (off) with the switch 35 closed (on) the diagnostic system will indicate an open circuit load fault.

While specific embodiments of the present invention have been shown and described, further modifications and improvements will occur to those skilled in the art. Such modifications could comprise having more or less than 11 driver stages which are to be sequentially tested and/or having loads other than solenoid loads. In addition, separate on and off pairs of high and low threshold values could be stored in the threshold storage device 21, as was previously indicated, wherein the controller 11 would select the appropriate pair of threshold values for use by the comparator 18 depending upon whether an on or off test was to be implemented. In addition, the driver stages 1 through 11 could be reconfigured such that each would receive the same high frequency submodulation signal SM, and this signal could be gated internally in the driver stage with the received primary modulation signal PM sent to each driver stage to obtain a substantially equivalent result. All such modifications which retain the basic underlying principles disclosed and claimed herein are within the scope of this invention.

We claim:
1. A multiple diagnostic fault test system comprising:
a plurality of electrical devices, each device selectively operative in effective on or off states in accordance with received control signals to control load apparatus associated with each of said devices;
control means coupled to said plurality of devices for providing said control signals thereto in accordance with predetermined criteria to achieve desired control of said devices;
means for testing each of said devices to insure proper operation of said devices and/or its associated load apparatus controlled thereby, said testing means including,
means for temporarily altering the control signal being provided to at least some of said devices such that each of said devices is maintained in a same predetermined one of said on and off states for a predetermined first time period,
means for monitoring each of said plurality of devices during said first time period for proper operation and developing a fault signal in response to detected improper operation, and
means for having said control means resume control of said devices after said first time period in accordance with said predetermined criteria.

2. A system according to claim 1 wherein said monitoring means includes means for sequentially monitoring each of said plurality of devices during said first time period.

3. A system according to claim 2 wherein said sequential monitoring of said devices occurs after an initial delay time after the beginning of said first time period.

4. A system according to claim 3 wherein said altering means automatically and repeatedly provides said first time period during which said control signals are altered and said monitoring of said devices occurs.

5. A system according to claim 2 wherein said monitoring means includes means for sequentially monitoring at least one signal from each of said devices during said first time period, and while monitoring said at least one signal, compares that signal to at least a first threshold value, said monitoring means providing a first fault signal if said monitored signal exceeds said first threshold value in a first predetermined polarity sense, said first fault signal being indicative of a first fault condition.

6. A system according to claim 5 wherein said monitoring means, while monitoring said one signal during said first period of time, also compares said one signal to at least a second threshold value, different from said first threshold value, said monitoring means providing a second fault signal if said monitored signal exceeds said second threshold value in a predetermined polarity sense, the providing of both said first and second fault signals being indicative of one fault condition for said device being monitored, while the providing of only one of said first and second fault signals being indicative of a different fault condition for said monitored device.

7. A system according to claim 6 wherein said monitoring means includes a comparator means for receiving said one monitored signal and for sequentially receiving said first and second threshold values for comparison with said monitored signal.

8. A system according to claim 1 wherein said control signal temporary altering means also temporarily alters the control signal being provided to at least some of said devices such that each of said devices are maintained in a different same predetermined one of said on or off states for a predetermined second time period, said predetermined second time period existing separate and apart from said predetermined first time period, the states of said devices maintained by said altering means during said predetermined first time period being different from the states of said devices being maintained by said altering means during said predetermined second time period.

9. A system according to claim 8 wherein said monitoring means includes means for sequentially monitoring each of said plurality of devices during said first time period and each of said plurality of devices during said second time period and for developing a fault signal in response to detected improper operation during said first and second time periods.

10. A system according to claim 9 wherein said sequential monitoring of said devices during said first time period occurs after an initial delay time after the beginning of said first time period, and said sequential monitoring of said devices during said second time period occurs after an initial delay time after the beginning of said second time period.

11. A system according to claim 10 wherein said monitoring means includes means for sequentially monitoring one signal from each of said devices during said first time period and sequentially monitoring one signal from each of said devices during said second time period, and while monitoring said one signal during said first and second time periods compares the monitored signal to at least a first threshold value, said monitoring means providing a first fault signal if said monitored signal exceeds said first threshold value in a first predetermined polarity sense.

12. A system according to claim 11 wherein said monitoring means, while monitoring said one signal during said first time period also compares said one signal to at least a second threshold value, said monitoring means providing a second fault signal if said monitored signal exceeds said second threshold value in a predetermined polarity sense, the providing of said first and second fault signals for a monitored signal being indicative of one fault condition for said device being monitored while the providing of only one of said fault signals being indicative of a different fault condition for said monitored device.

13. A system according to claim 12 wherein during said second time period the same first and second threshold values utilized by said monitoring means to provide said first and second fault signals are utilized by said monitoring means to provide fault signals indicative of device operation during said second time period.

14. A system according to claim 1 wherein each of said electrical devices comprises a driver stage for controlling an associated solenoid valve which comprises said load apparatus.

15. A system according to claim 14 wherein said control signal altering means maintains said driver stages in a predetermined effective off state during said predetermined first time period, but wherein said first time period is insufficient to permit any solenoid valve load apparatus in an actuated state immediately prior to said first time period to return to a nonactuated state during said first time period.

16. A system according to claim 15 wherein said monitoring means includes means for sequentially monitoring one signal from each of said devices during said first predetermined time period, and while monitoring said one signal compares that signal with at least two different threshold values and provides a first fault signal if said monitored signal exceeds one of said threshold values in a first predetermined polarity sense and a second fault signal if said monitored signal exceeds another of said threshold values in a predetermined polarity sense, the providing of only one of said first or second fault indicative signals being indicative of one type of faulty operation while the providing of both fault signals being indicative of a different fault condition.

17. A system according to claim 16 wherein said sequential monitoring of said devices occurs after an initial delay time after the beginning of said first time period.

18. A device diagnostic fault test circuit comprising:
at least one electrical device selectively operative in effective on or off states in accordance with received control signals to control load apparatus associated with said device;
control means coupled to said device for providing said control signals to said device in accordance with predetermined criteria to achieve desired control of said device;
means coupled to said device for testing said device for faulty operation of said device and/or its associated load apparatus controlled thereby;
said testing means including,
means coupled to said device for monitoring, during a predetermined first time period while said device is in a predetermined one of said on and off states, at least one signal from said device and comparing the magnitude of said monitored signal with both first and second threshold values, said first and second threshold values being distinct from each other, said testing means providing a first fault signal if said monitored signal exceeds said first threshold value in a first predetermined polarity sense and providing a second fault signal if said monitored signal exceeds said second threshold value in a predetermined polarity sense, the providing of just said first fault signal being indicative of a first type of faulty operation while the providing of both of said first and second fault signals being indicative of a second different type of faulty operation.

19. A circuit according to claim 18 wherein said testing means not only includes said means for monitoring said one signal during said first time period while said device is in said predetermined one of said on and off states, but also includes means for monitoring said signal while said device is in an opposite one of said on and off states during a predetermined second time period separate and non-overlapping with said first time period.

20. A circuit according to claim 19 wherein said testing means includes means for comparing said one signal monitored during said second time period with at least two different threshold values, said monitoring means providing a third fault signal if said monitored signal exceeds one of said second time period threshold values in a predetermined polarity sense during said second time period and for providing a fourth fault signal if said one monitored signal exceeds another of said second time period threshold values in a predetermined polarity sense during said second time period, the providing of just said third fault signal being indicative of a third type of faulty operation while the providing of both said third and fourth fault signals being indicative of a different fourth type of faulty operation each of said first, second, third and fourth types of faulty operation being distinct from each other.

21. A circuit according to claim 20 wherein said threshold values utilized by said testing means during said first time period, while distinct from each other, are substantially identical to said threshold values utilized by said testing means during said second time period.

22. A circuit according to claim 21 wherein said device comprises a driver stage and said load apparatus comprises a solenoid valve controlled by said driver stage.

23. A circuit according to claim 20 wherein said control means maintains said device in said on state by supplying a high frequency pulse signal as an input signal to said device during said on state, and wherein said testing means includes means for testing said device in said on state by interrupting said pulse signals and maintaining a constant input signal to said device to maintain said device in an on state during said first time period and interrupting said pulse signals and maintaining a different constant input signal to said device to maintain said device in an off state during said second time period.

24. A circuit according to claim 23 wherein said control means implements control signals for controlling a plurality of said devices with each of said devices being monitored during on and off states in a similar manner by said testing means sequentially testing each of said devices during a common on state therefor during a common first time period during which two threshold values are compared with each of said monitored signals from each of said devices and for testing each of said devices in a common off state during a common second time period, non-overlapping with respect to said first time period, during which all of said devices are maintained in an off state and during which each of said devices has a signal thereof effectively compared with two threshold values for determining proper operation of said devices.

25. A circuit according to claim 18 wherein said device comprises a switch connected in series with its associated load apparatus across a source of potential, said switch normally acting as an effective short circuit during its effective on state and an effective open circuit during its effective off state, said first time period corresponding to said switch being in its off state, said monitored signal corresponding to a signal existing between said switch and said load apparatus, and said first and second threshold values being selected such that, in combination with biasing circuitry means coupled to said switch and said load apparatus, a first type of fault operation of said switch and load apparatus being indicated by said monitored signal exceeding both of said first and second threshold values in a first predetermined polarity sense, a second type of fault operation, different from said first type of fault operation, being indicated by said monitored signal exceeding just one of said threshold values in said first polarity sense but not the other, and normal operation of said switch and load apparatus being indicated by said monitored signal failing to exceed either of said threshold values in said first polarity sense.

26. A circuit according to claim 25 wherein said first type of fault operation corresponds to a short circuit across said switch and said second type of fault operation corresponds to said load apparatus comprising an open circuit.

27. A circuit according to claim 26 wherein said testing means not only includes said means for monitoring said one signal during said first time period while said device is in said predetermined one of said on and off states, but also includes means for monitoring said signal while said device is in an opposite one of said on and off states during a predetermined second time period separate and non-overlapping with said first time period, and wherein said testing means includes means for comparing said one signal monitored during said second time period with at least two different threshold values, said monitoring means providing a third fault signal if said monitored signal exceeds one of said second time period threshold values in a predetermined polarity sense during said second time period and for providing a fourth fault signal if said one monitored signal exceeds another of said second time period threshold values in a predetermined polarity sense during said second time period, the providing of just said third fault signal being indicative of a third type of faulty operation while the providing of both said third and fourth fault signals being indicative of a different fourth type of faulty operation, each of said first, second, third and fourth types of faulty operation being distinct from each other, and wherein said second time period corresponds to said switch being in its on state, and said second time period threshold values being selected such that, in combination with biasing circuitry means coupled to said switch and said load apparatus, said third type of fault operation being indicated by said monitored signal exceeding both of said second time period threshold values in a first predetermined polarity sense, said fourth type of fault operation, different from said third type of fault operation, being indicated by said monitored signal exceeding one of said second time period threshold values in said first polarity sense but not the other, and normal operation of said switch and load apparatus being indicated by said monitored signal failing to exceed either of said second time period threshold values in said first polarity sense during said second time period.

28. A circuit according to claim 27 wherein said third type of fault operation corresponds to a short circuit across said load apparatus and said fourth type of fault operation corresponds to said switch comprising an open circuit.

29. A circuit according to claim 25 wherein said monitoring means includes a comparison means which receives said monitored signal as an input and sequentially compares it to said first and second threshold values to provide said first and second fault signals and wherein said comparison means includes means for storing first and second reference signals corresponding to said first and second threshold values and means for selectively, sequentially providing said first and second reference signals as input signals to said comparison means.

30. A circuit according to claim 18 wherein said monitoring means includes a comparison means which receives said monitored signal as an input and sequentially compares it to said first and second threshold values to provide said first and second fault signals.

31. A circuit according to claim 30 wherein said comparison means includes means for storing first and second reference signals corresponding to said first and second threshold values and means for selectively, sequentially providing said first and second reference signals as input signals to said comparison means.

* * * * *